(12) United States Patent
Pritiskutch et al.

(10) Patent No.: US 9,018,765 B2
(45) Date of Patent: Apr. 28, 2015

(54) PREVENTING SHORTING DENDRITIC MIGRATION BETWEEN ELECTRODES

(71) Applicant: STMicroelectronics, Inc., Coppell, TX (US)

(72) Inventors: John C. Pritiskutch, Orwigsburg, PA (US); Richard R. Hildenbrandt, Bath, PA (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/027,370

(22) Filed: Sep. 16, 2013

(65) Prior Publication Data

US 2014/0138834 A1    May 22, 2014

Related U.S. Application Data

(60) Provisional application No. 61/728,034, filed on Nov. 19, 2012.

(51) Int. Cl.
*H01L 29/417* (2006.01)
*H01L 23/00* (2006.01)

(52) U.S. Cl.
CPC ........ *H01L 29/41716* (2013.01); *H01L 23/564* (2013.01); *H01L 2924/0002* (2013.01)

(58) Field of Classification Search
CPC .... H01L 28/86; H01L 28/88; H01L 29/41716
See application file for complete search history.

(56) References Cited

U.S. PATENT DOCUMENTS

| 2006/0088996 A1* | 4/2006 | Wu et al. ........................ 438/637 |
| 2009/0266582 A1* | 10/2009 | Sakurai et al. ................ 174/250 |
| 2010/0143760 A1* | 6/2010 | DeRose et al. ................. 429/30 |

* cited by examiner

*Primary Examiner* — Daniel Luke
(74) *Attorney, Agent, or Firm* — Gardere Wynne Sewell LLP

(57) ABSTRACT

In a general aspect, an integrated circuit package includes a first electrode and a second electrode on a support substrate. The first electrode and the second electrode are configured to be electrically coupled to a voltage differential. A dendritic migration of a migratory species can develop under the voltage differential and a non-hermetic environment. The dendritic migration is interrupted by a floating electrical barrier mounted onto the support substrate between the first electrode and the second electrode. The electrical barrier includes a dam for preventing the metal migration. The dam has a height approximately equal to or greater than the largest dimension of a single atom of the migratory species. The first electrode and the second electrode can be mounted on the same side of the support substrate, or on two opposite sides of the support substrate.

20 Claims, 6 Drawing Sheets

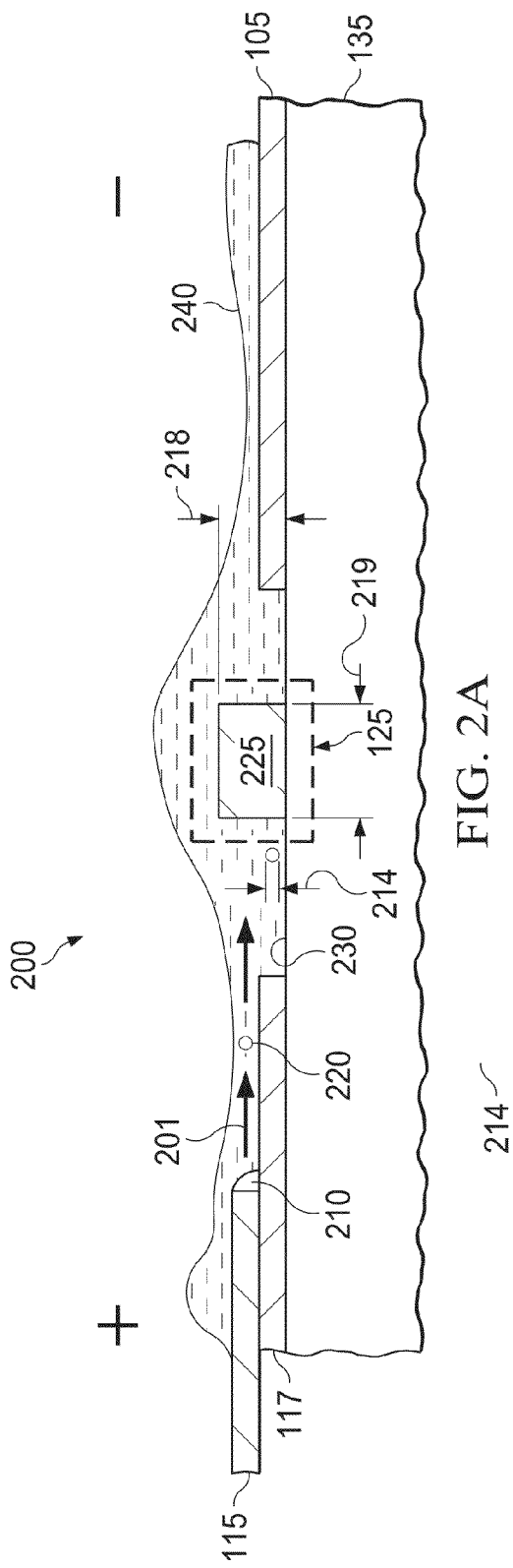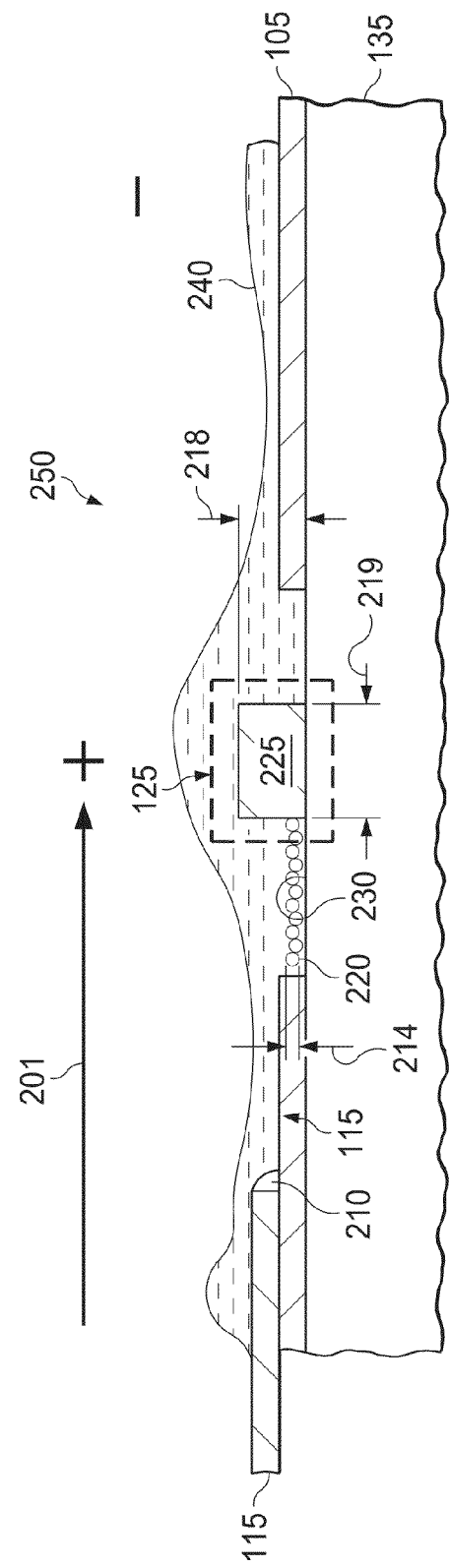

PREVENTING SHORTING DENDRITIC MIGRATION BETWEEN ELECTRODES

PRIORITY CLAIM

This application claims priority from U.S. Provisional Application for Patent No. 61/728,034 filed Nov. 19, 2012, the disclosure of which is incorporated by reference.

TECHNICAL FIELD

The invention relates to integrated circuit packaging, and more particularly to preventing dendritic migration within integrated circuit packages.

BACKGROUND

In many instances, a dendritic migration can develop between two electrodes under a voltage differential. For example, a migratory species (e.g., silver) within one of the two electrodes can migrate in a dendritic pattern when moisture (e.g., in a non-hermetically sealed integrated circuit package, or an integrated circuit package having a compromised hermetic seal) and the voltage differential are present. The migration of the migratory species follows the direction of the field created by the voltage differential. The dendritic migration can, in time, bridge one electrode to the other electrode and cause a short circuit failure.

Occurrence of a dendritic migration requires, for example, a migratory species, a differential field, a migration surface, and a migration environment. In some instances, the migratory species can include silver (e.g., from the silver brazing used in joining electrodes). The differential field can include a voltage differential or other types of electromagnetic fields capable of providing a field force. The migration surface can be an even surface of a support substrate. The migration environment can include a moisture layer due to humidity condensation on a non-hermetic (e.g., not airtight) integrated circuit package.

Air cavities in non-hermetic semiconductor packages are prone to cause the aforementioned dendritic migration effects, which can eventually change the electrical characteristics of a device toward an eventual short circuit failure. Some known expensive solutions include: removing the migratory species from the electrodes, and/or flooding the air cavities with a substance that can reduce or remove the migration environment (e.g., reducing surface humidity).

SUMMARY

In a general aspect, an integrated circuit package includes a first electrode and a second electrode on a support substrate. The first electrode and the second electrode are configured to be electrically coupled to a voltage differential. The integrated circuit package further includes a floating electrical barrier, which includes a dam mounted to the support substrate. The dam is located between the first electrode and the second electrode in a position to prevent metal migration.

In one specific aspect, the metal migration in the integrated circuit package includes a movement of a migratory species. When the integrated circuit package is exposed to a moisture layer and the first electrode and the second electrode are under the voltage differential, the migratory species migrates from the first electrode to the second electrode on a migration surface provided by the support substrate.

In a second specific aspect, the dam has a height approximately equal to or greater than the largest dimension of a single atom of the migratory species. In some implementations, the migration species includes silver.

In a third specific aspect, the dam includes nickel. In some implementations, the nickel is sintered nickel.

In a fourth specific aspect, the dam is fabricated using a screen printing technique. In some implementations, the dam has a height of a general material thickness produced with a screen printing technique, and a width producing an insignificant change to an electrical characteristics of the first and the second electrodes. In some implementations, the dam has a height of about 0.0125 mm and a width of about 0.05 mm.

In a fifth specific aspect, the first electrode and the second electrode are on the same side of the support substrate.

In a sixth specific aspect, the first electrode and the second electrode are on two opposite sides of the support substrate.

In another general aspect, a semiconductor package includes a first electrode and a second electrode on a support substrate. The first electrode and the second electrode are configured to be electrically coupled to a voltage differential. The semiconductor package further includes an electrical barrier mounted to the support substrate. The electrical barrier is located between the first electrode and the second electrode.

In a specific aspect, the electrical barrier is configured to prevent metal migration of a migratory species from the first electrode, when exposed to a moisture layer and under the voltage differential, toward the second electrode on a migration surface provided by the support substrate.

In a second specific aspect, the electrical barrier includes a separator having a cross sectional height approximately equal to or greater than the largest dimension of a single atom of the migratory species. In some implementations, the migratory species include silver.

In a third specific aspect, the electrical barrier includes nickel. In some implementations, the nickel is sintered nickel.

In a fourth specific aspect, the electrical barrier has a height of a general material thickness produced with a screen printing technique and a width producing an insignificant change to an electrical characteristics of the first and the second electrodes.

In a fifth specific aspect, the first electrode and the second electrode are on a same side of the support substrate.

In a sixth specific aspect, the first electrode and the second electrode are on two opposite sides of the support substrate.

Other aspects, features, and advantages will become apparent from the following detailed description when taken in conjunction with the accompanying drawings, which are part of this disclosure and which illustrate, by way of example, principles of the inventions disclosed.

BRIEF DESCRIPTION OF THE DRAWINGS

Other advantages and characteristics of the invention will become apparent on studying the detailed description of implementations and embodiments, which imply no limitation, and the appended drawings, in which:

FIGS. 2A and 2B are schematic cross sectional side views of the integrated circuit package illustrated in FIG. 1 at reference line A-A;

FIGS. 3A and 3B are images of a top of a portion of an actual integrated circuit package having dendritic migration, wherein FIG. 3B shows a close-up image of an area within FIG. 3A; and FIGS. 4A and 4B are perspective views of a cross-sectioned integrated circuit package, wherein FIG. 4A shows the integrated circuit package without an electrical barrier and FIG. 4B shows the integrated circuit package having an electrical barrier.

DETAILED DESCRIPTION OF THE DRAWINGS

Figure 1:
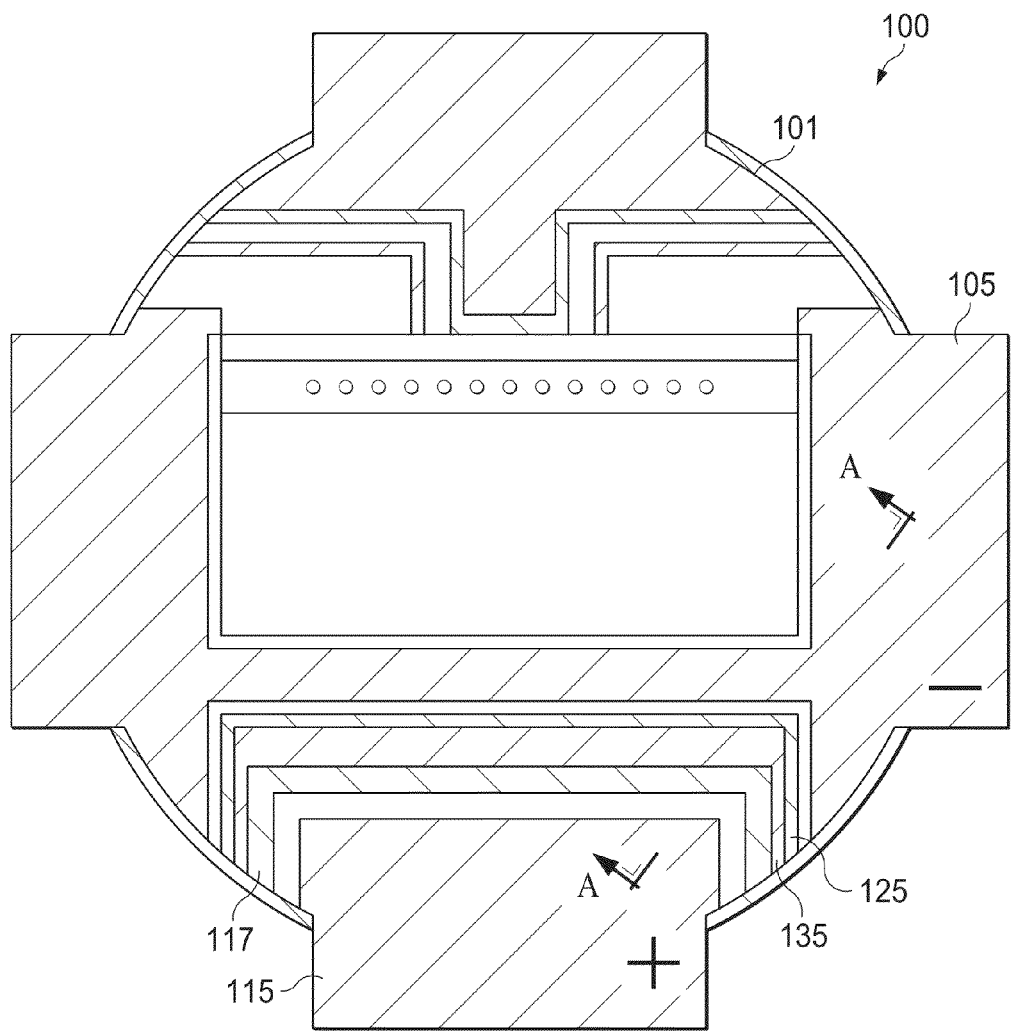
FIG. 1 is a schematic top view of an integrated circuit package.

FIG. 1 is a schematic top view 100 of an integrated circuit package 101. The integrated circuit package 101 can be, for example, a non-hermetic (e.g., not airtight) radio frequency transistor package. As illustrated in FIG. 1A, the integrated circuit package 101 includes a cathode 105 (designated "−"), an anode 115 (designated "+"), and an electrical barrier 125 disposed onto a support substrate 135. The cathode 105 and the anode 115 are configured to be electrically coupled to a voltage differential. A silver alloy brazing may be used in the formation of the cathode 105 and the anode 115. The anode 115 can be extended onto an electrode 117 (e.g., by soldering or blazing). In the implementation disclosed herein, the support substrate 135 includes beryllium oxide; yet the support substrate 135 may be made of any appropriate different material.

When the cathode 105 and the anode 115 are under a voltage differential, a silver dendrite can form starting from a silver alloy brazing at the anode 115 and moving toward the cathode 105 (this is further described below and depicted in FIGS. 3A and 3B). The voltage differential and a moisture layer (e.g., caused by condensation) can enable silver atoms of the silver alloy brazing to migrate in such a manner whereby silver ions ($Ag^+$) from the silver alloy brazing are reduced to silver oxide ($Ag_2O$), which stacks dendritically at the highest field points. As the $Ag_2O$ accumulates, the dendritic migration crosses over the surface of the substrate 135 for the integrated circuit package 101, along the direction of the field of the voltage differential in a direction toward the cathode 105. If the dendritic migration is uninterrupted, the silver dendrite may eventually bridge the anode 115 to the cathode 105 and short the integrated circuit package 101.

In some implementations, a migratory species can exist in the cathode 105, the anode 115, and/or any conductive material thereon. For example, silver is a common migratory species found in brazing, soldering, and/or electrodes. The migratory species may start migrating from locations near or at the electrodes. Other metallic atoms may also migrate as a migratory species, such as gold. Silver and silver dendrite are used in the dendritic migration examples herein. Other materials or elements may also be a migratory species instead of silver.

The electrical barrier 125 is configured to prevent shorting between the cathode 105 and the anode 115 by stopping the $Ag_2O$ from migrating all-the-way across the surface of the substrate 135. For example, the electrical barrier 125 can operate as a wall to stop the movement of the migrating silver atoms in a position midway between the electrodes. At a high level, when the silver dendrite connects the anode 115 to the electrical barrier 125, the anode reference point "+" changes from the anode 115 to the electrical barrier 125. At the electrical barrier 125, the $Ag_2O$ requires a higher level of energy to re-ionize for further migration. The required higher level of energy is not available. Therefore, the $Ag_2O$ remains consumed by the electrical barrier 125. Details of the electrical barrier 125 are illustrated in FIGS. 2A and 2B.

In some implementations, the integrated circuit package 101 may be mass produced with a hermetic seal and use the electrical barrier 125 as a fail-safe for the hermetic seal.

FIGS. 2A and 2B are schematic cross sectional side views of the integrated circuit package 101 at reference line A-A. FIG. 2A illustrates a dendritic migration process 200 of the silver atoms 220; FIG. 2B illustrates a saturated state 250 of the dendritic migration being stopped by the electrical barrier 125. In the implementation illustrated in FIGS. 2A and 2B, both electrodes (i.e., the anode 115 and the cathode 105) are disposed on the same side of the support substrate 135.

Referring first to FIG. 2A, the dendritic migration process 200 shows one or more migratory species atoms 220 progressing from the anode 115 toward the cathode 105. More specifically, the migratory species atoms 220 originate at the brazing 210 at the anode 115. For example, the migratory species atoms 220 can be silver atoms (e.g., $Ag_2O$); and the brazing 210 can be silver brazing used to connect the anode 115 to the electrode 117 on the support substrate 135. In other implementations, the migratory species atoms 220 may be of a different material.

The migratory species atoms 220 are excited under a field force created when a voltage differential is electrically coupled between the anode 115 and the cathode 105. The migratory species atoms 220 migrate onto the migration surface 230 of the support substrate 135 toward the cathode 105 by accumulative disposition. The migration surface 230 can include beryllium oxide or other suitable substrate materials.

The electrical barrier 125 includes a dam 225 mounted to the support substrate 135. The dam 225 is disposed between the anode 115 in the cathode 105. In some implementations, the anode 115, the cathode 105, the support substrate 135, and the electrical barrier 125 can be enclosed by a moisture layer 240. For example, temperature variations can cause condensation or a relatively high humidity around the integrated circuit package. The dendritic migration can become active (e.g., turning from $Ag^+$ to $Ag_2O$) under the influence of the moisture layer 240, and the presence of the voltage differential coupled with the anode 115 in the cathode 105.

In the implementation disclosed herein, the dam 225 has a rectangular cross-section, wherein one side is sealingly affixed (e.g., by adherence) onto the migration surface 230 of the support substrate 135. The dam 225 has a height 218 of approximately equal to or greater than the largest dimension 214 of a single atom 220 of the migratory species (e.g., a theoretical diameter of a migratory species atom 220). In practice, the actual height 218 is usually substantially greater than the largest dimension 214 due to manufacture process for the dam 225, such as screen printing for example. Because the migratory species atoms 220 are actuated under the field force parallel to the migration surface 230, the migratory species atoms 220 would not move or stack upward as to climb onto and over the dam 225.

In some implementations, the dam 225 includes nickel. For example, the dam 225 can be a floating electrode made of nickel and plated with gold. In some instances, the nickel used in the dam 225 is sintered nickel. The dam 225 can be fabricated using a screen printing technique. By masking off unwanted areas, a layer of specific materials (i.e., forming the dam 225) can be disposed onto the migration surface 230 at a particular width 219. In some implementations, the dam 225 can include other material that is not metallic, such as ceramic, resin, or other materials that can adhere to the migration surface 230.

The width 219 of the dam 225 is specified so that insignificant change is produced to the electrical characteristics between the anode 115 in the cathode 105. For example, the capacitance between the 2 electrodes (i.e., the anode 115 in the cathode 105) is not significantly altered. Other characteristics besides capacitance may also be considered and used to specify the width 219 of the dam 225.

The height of the dam 225 is the thickness of the general material (e.g., sintered nickel plated with gold) used in the screen printing technique. In practice, the thickness of the general material used in the screen printing technique is often multiple times greater than the largest dimension 214 of the migratory species atoms 220. Therefore the height of the dam 205 can satisfy required specifications as a result of the application of the screen printing technique. For example, the dam 225 has a height 218 of about 0.0125 mm (about 0.0005 in) and a width 219 of about 0.05 mm (about 0.002 in).

Turning now to FIG. 2B, the saturated state 250 shows the migratory species atoms 220 has filled the available space between the anode 115 and the dam 225. The migratory species atoms 220 have bridged the anode 115 with the dam 225, making the dam 225 the actual anode (i.e., positive charge at the dam 225). The migratory species atoms 220 cannot pass over the dam 225 and are arrested or accumulated in between the anode 115 and the dam 225 (e.g., the migratory species lacks energy for re-ionization). In the current implementation, the dam 225 includes sintered nickel plated with gold and does not include any migratory species (i.e., silver). Therefore the dam 225 would not have migratory species to form a dendritic migration toward the cathode 105.

The width of the dam 225 and the distance between the dam 225 and the cathode 105 are designed such that, when the dendritic migration has connected the anode 115 to the dam 225 and having the dam 225 to become the actual anode, the related impact to electrical parameters does not affect normal circuit operation. For example, the capacitance between the anode 115 and cathode 105, if used in a circuit, may not substantially vary as a result of the dam 225 becoming an effective anode due to the bridging of the migratory species atoms 220.

In some implementations, according to the specification of the migratory species, a corresponding different material can be selected for the dam 225. For example, although gold is much more inert than silver, it may be considered as a migratory species when silver is absent and the environment is promoting dendritic migration. A different composition may then be used in the dam 225, such as sintered nickel without any plating.

Figure 3A:
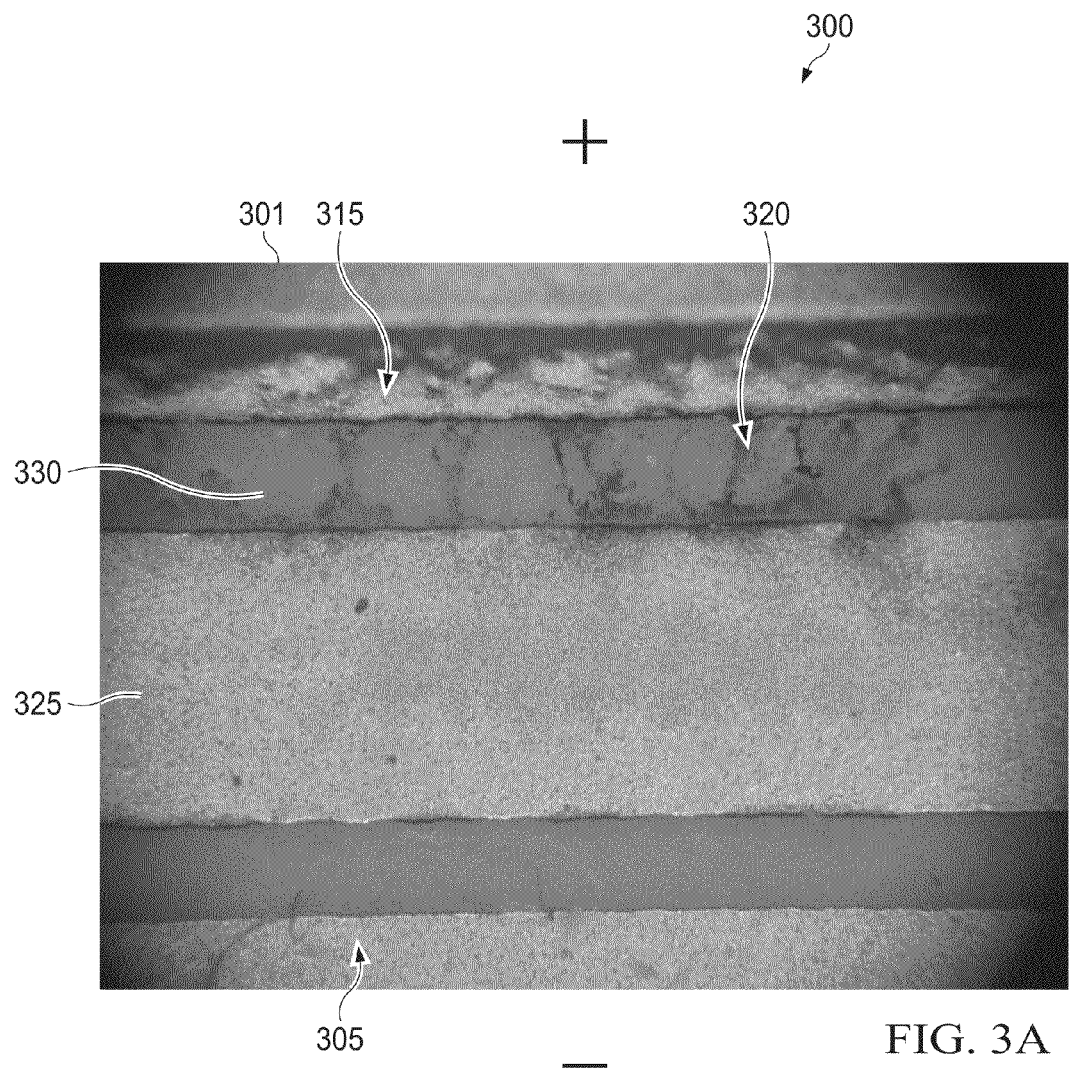
Figure 3B:
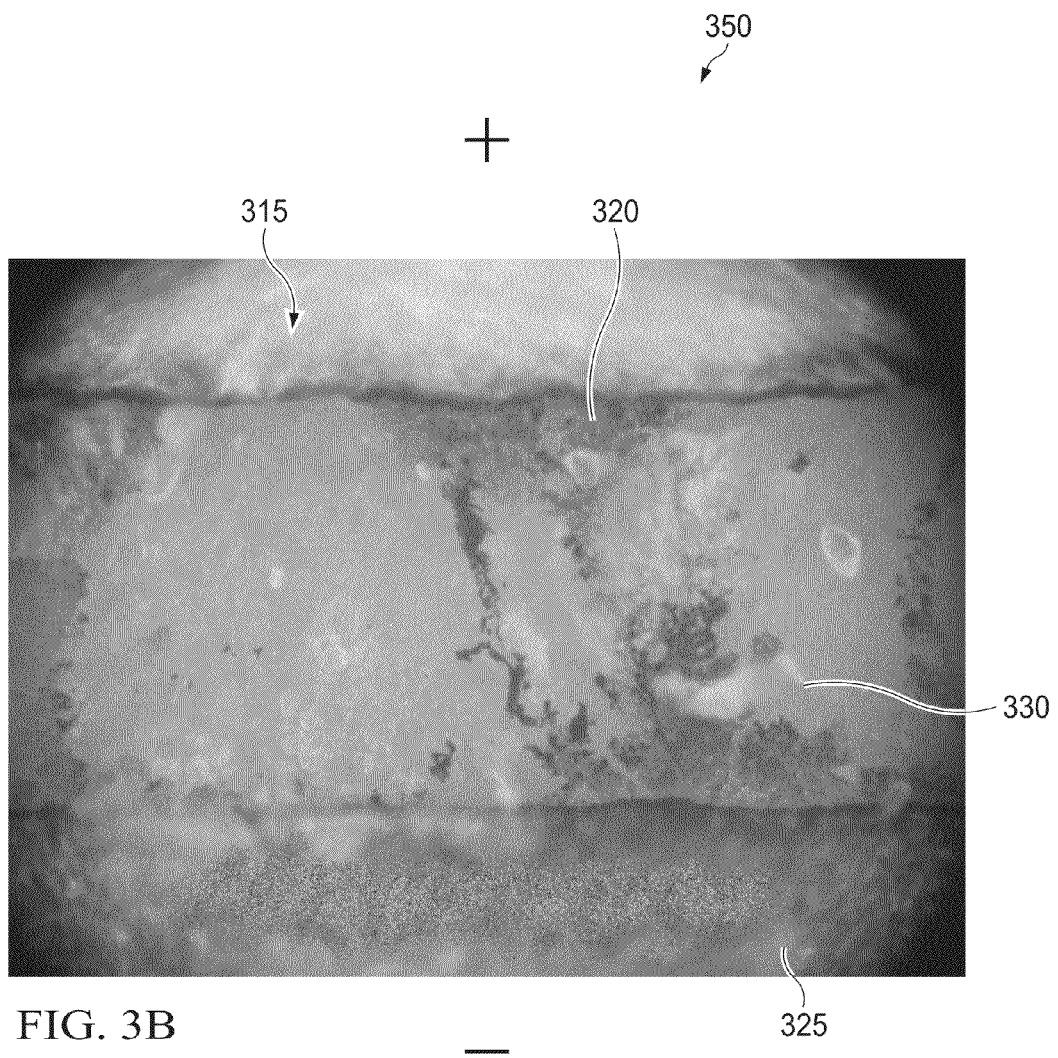

FIGS. 3A and 3B are images of a portion 301 of an actual integrated circuit package having dendritic migration interrupted by a floating electrode barrier 325, wherein FIG. 3B shows a close-up view 350 of FIG. 3A. In FIG. 3A, the image 300 shows the portion 301 having a first electrode 315, the floating electrode barrier 325, and a second electrode 305, all of which are placed on a support substrate 330. The first electrode 315 is an anode similar to the anode 115 shown in FIG. 1; and the second electrode 305 is a cathode similar to the cathode 105. Dendritic migrations 320 are migrating from the first electrode 315 toward the second electrode 305. The dendritic migrations 320 are stopped at the floating electrode barrier 325. In the close up view 350 of FIG. 3B, the dendritic migration 320 can be seen clearly, having been blocked by the floating electrode barrier 325 and starting to saturate the migration surface on the support substrate 330.

Figure 4A:
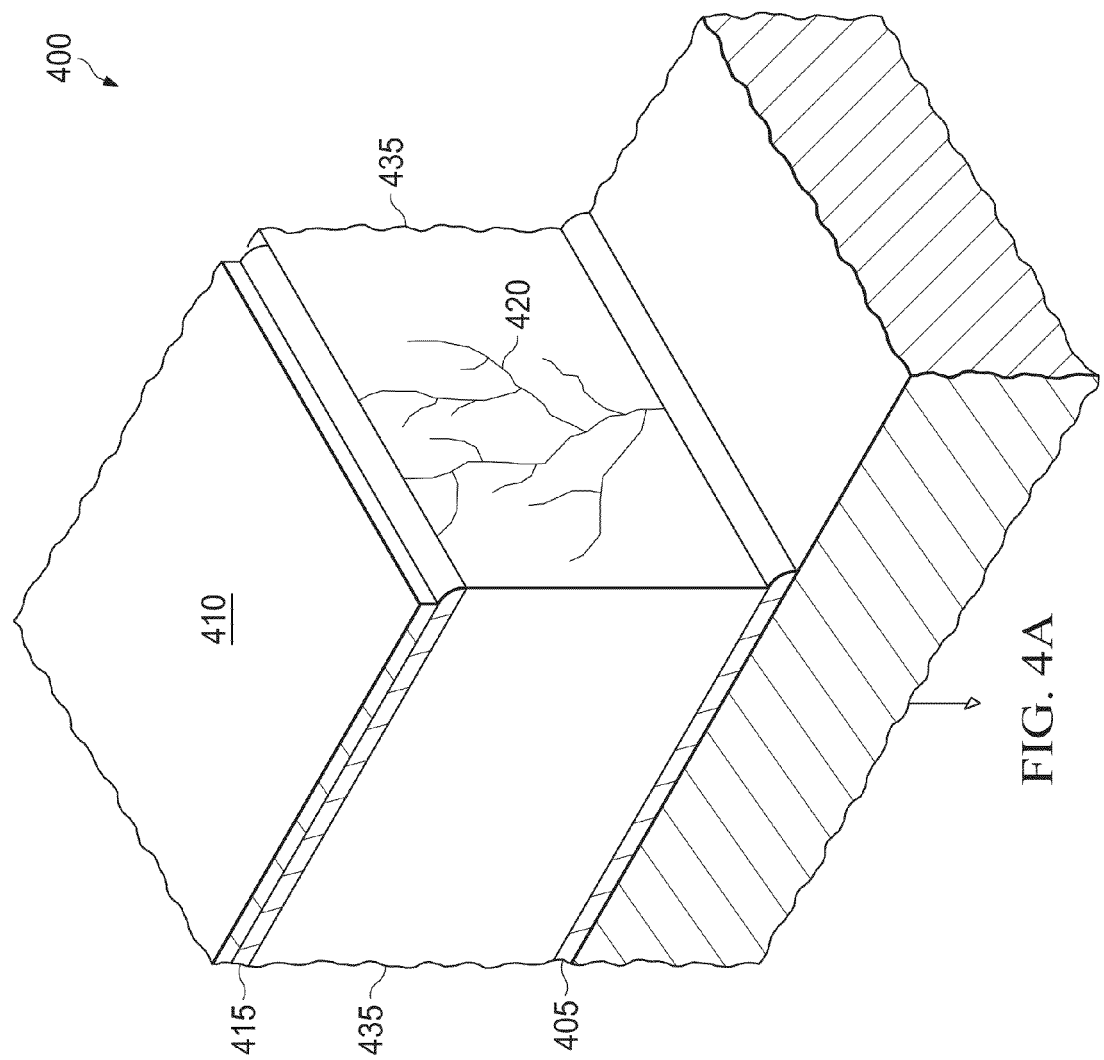
Figure 4B:
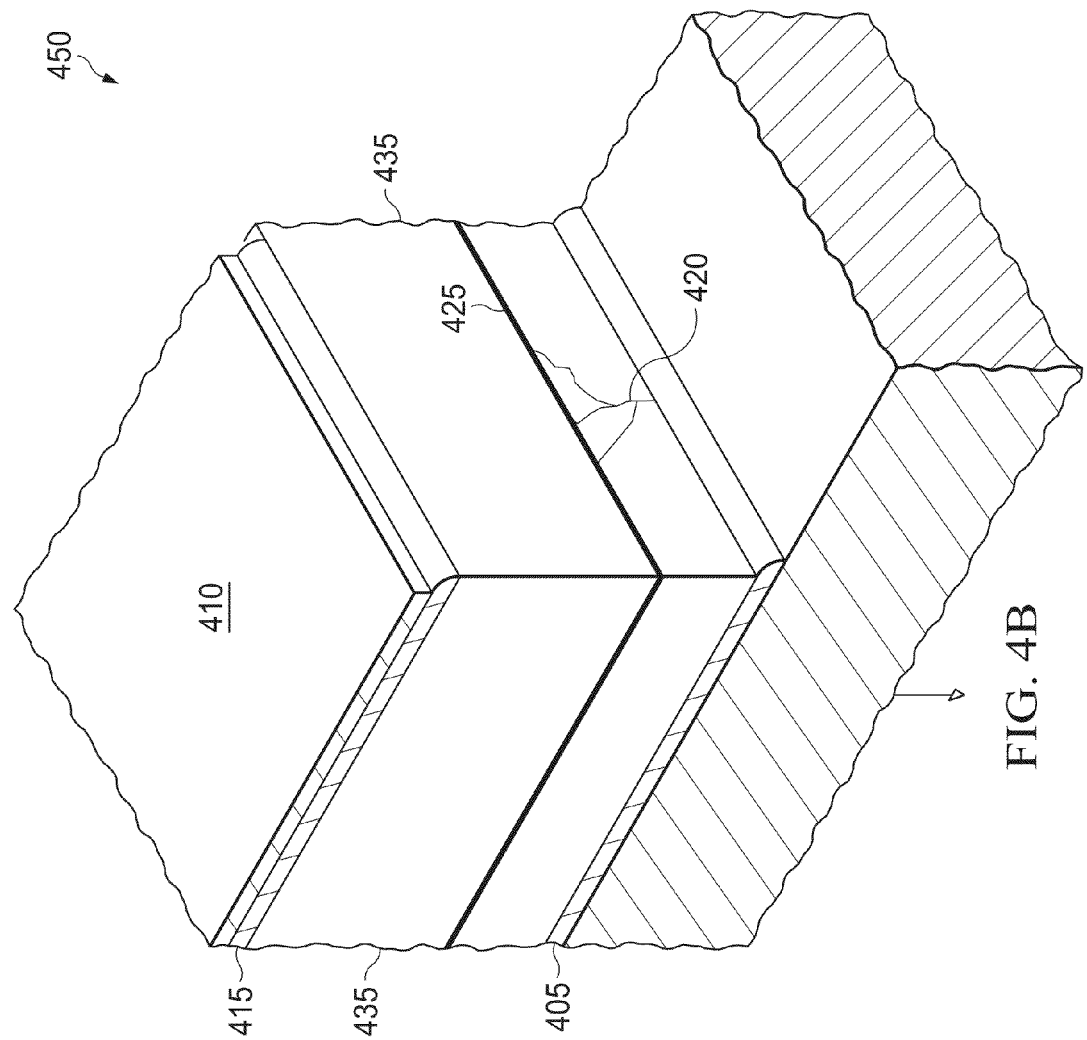

FIGS. 4A and 4B are perspective views of a cross-sectioned integrated circuit package 410. FIG. 4A shows the perspective view 400 of the integrated circuit package 410 without an electrical barrier; and FIG. 4B shows the perspective view 450 of the integrated circuit package having an electrical barrier 425.

Turning now to FIG. 4A, the integrated circuit package 410 includes at least a first electrode 405 and a second electrode 415. The first electrode 405 and the second electrode 415 are mounted on two opposite sides of a support substrate 435. For example, the first electrode 405 and the second electrode 415 can each be an electrode made of a copper-silver alloy. A dendritic migration 420 (e.g., of the silver in the electrode 405) migrates from the first electrode 405 toward the second electrode 415 to cross the migration surface of the support substrate 435. The dendritic migration 420 is not interrupted and bridges the first electrode 405 to the second electrode 415, shorting the circuit.

In FIG. 4B, the dendritic migration 420 is interrupted by the floating electrical barrier 425. The floating electrical barrier 425 is affixed onto the vertical migration surface of the support substrate 435. Because the migratory species is actuated along the field a voltage differential, the physical orientation of the electrodes 405 and 415 is less pertinent to the dendritic migration 420. The floating electrical barrier 425 can therefore prevent the dendritic migration 420 from advancing in a similar manner as the dam 225 shown in FIGS. 2A and 2B.

In the foregoing description of certain embodiments, specific terminology has been resorted to for the sake of clarity. However, the disclosure is not intended to be limited to the specific terms so selected, and it is to be understood that each specific term includes other technical equivalents which operate in a similar manner to accomplish a similar technical purpose. Terms such as "left" and right", "front" and "rear", "above" and "below" and the like are used as words of convenience to provide reference points and are not to be construed as limiting terms.

The foregoing describes only some implementations; alterations, modifications, additions and/or changes made thereto without departing from the scope and spirit of the disclosed embodiments, the embodiments being illustrative and not restrictive. For example, even though the previous discussion focused on migration of a silver migratory species, other metallic or nonmetallic atoms used in the electrodes may also have dendritic migration, which can be stopped by a barrier similar to the electrical barrier 125 described above. In addition, the barrier may also be made of other materials, conductive or not, such as ceramic, polymeric, and/or composite materials.

Furthermore, implementation(s) have been described in connection with what are compliant with the requirement of a patent disclosure. Other implementation is not limited to the disclosed examples. Various modifications and equivalent arrangements are included within the scope of the following claim(s).

What is claimed is:

1. An integrated circuit package, comprising:
   a first electrode and a second electrode on a support substrate made of a non-electrically conductive material, wherein the first electrode and the second electrode are configured to be electrically coupled to a voltage differential; and
   a floating electrical barrier comprising a dam made of an electrically conductive material mounted to the support substrate and located between the first electrode and the second electrode, the dam configured to prevent metal migration.

2. The integrated circuit package of claim 1, wherein the metal migration comprises a movement of a migratory species from the first electrode, when exposed to a moisture layer and under the voltage differential, to the second electrode on a migration surface provided by the support substrate.

3. The integrated circuit package of claim 1, wherein the dam has a height approximately equal to or greater than the largest dimension of a single atom of a migratory species of said metal.

4. The integrated circuit package of claim 3, wherein the migratory species comprises silver.

5. The integrated circuit package of claim 1, wherein the electrically conductive material for the dam comprises nickel.

6. The integrated circuit package of claim 5, wherein the nickel is sintered nickel.

7. The integrated circuit package of claim 1, wherein the dam is fabricated using a screen printing technique.

8. The integrated circuit package of claim 1, wherein the dam has a height of a general material thickness produced with a screen printing technique and a width producing an insignificant change to an electrical characteristics of the first and the second electrodes.

9. The integrated circuit package of claim 1, wherein the dam has a height of about 0.0125 mm and a width of about 0.05 mm.

10. The integrated circuit package of claim 1, wherein the first electrode and the second electrode are on a same side of the support substrate.

11. The integrated circuit package of claim 1, wherein the first electrode and the second electrode are on two opposite sides of the support substrate.

12. A semiconductor package, comprising:
a first electrode and a second electrode on an insulating support substrate, wherein the first electrode and the second electrode are configured to be electrically coupled to a voltage differential; and
a floating electrically conductive barrier mounted to the insulating support substrate and located between the first electrode and the second electrode, the electrically conductive barrier configured to prevent metal migration of a migratory species from the first electrode to the second electrode.

13. The semiconductor package of claim 12, wherein the floating electrically conductive barrier is configured to prevent metal migration, when the semiconductor package is exposed to a moisture layer and under the voltage differential, on a migration surface provided by the insulating support substrate.

14. The semiconductor package of claim 13, wherein the floating electrically conductive barrier comprises a dam having a cross sectional height approximately equal to or greater than the largest dimension of a single atom of the migratory species.

15. The semiconductor package of claim 13, wherein the migratory species comprises silver.

16. The semiconductor package of claim 12, wherein the floating electrically conductive barrier comprises nickel.

17. The semiconductor package of claim 16, wherein the nickel is sintered nickel.

18. The semiconductor package of claim 12, wherein the floating electrically conductive barrier has a height of a general material thickness produced with a screen printing technique and a width producing an insignificant change to an electrical characteristics of the first and the second electrodes.

19. The semiconductor package of claim 12, wherein the first electrode and the second electrode are on a same side of the insulating support substrate.

20. The semiconductor package of claim 12, wherein the first electrode and the second electrode are on two opposite sides of the insulating support substrate.

* * * * *